STORAGE DIODE PULSE SIGNAL GENERATOR

Filed Sept. 27, 1963

INVENTORS C. J. N. CANDY
D. E. ROWLINSON
BY G. E. Kersey
ATTORNEY 3,292,006

STORAGE DIODE PULSE SIGNAL GENERATOR

Charles J. N. Candy, Convent Station, and Donald E. Rowlinson, Bridgewater Township, Somerset County, N.J., assignors to Bell Telephone Laboratories, Incorporated, New York, N.Y., a corporation of New York Filed Sept. 27, 1963, Ser. No. 312,225
5 Claims. (Cl. 307—88.5)

This invention relates to the generation of pulse signals, particularly when subject to prescribed constraints.

A pulse signal is a burst of energy. Starting at an initial level, it rises to a peak magnitude, endures for a preassigned interval and subsequently falls, typically to its original level. Signals of this kind are useful in the processing and transmission of information. But there usefulness is contingent upon the satisfaction of certain conditions or constraints.

Clearly a pulse signal should attain its peak level quickly, i.e., have a reasonably rapid rise time. Otherwise it is difficult to determine the time scale of the pulse and it becomes necessary to widely separate the pulse signals from each other to prevent interference due to overlap. Similar considerations apply to the fall time.

In addition, a pulse signal must have sufficient duration to allow an appropriate response to it by the equipment that processes it. Unfortunately, where the transitions are extremely abrupt and durations short as in high-speed pulse signals, it becomes difficult to control the duration of the interval.

Consequently it is an object of the invention to reduce the transition times of pulse signals. A related object is to generate high-speed pulse signals. A further object is to accurately control the duration of high-speed pulse signals.

In accomplishing the foregoing and related objects the invention provides for energizing a first storage diode in conjunction with a second, pre-biased storage diode. A storage diode is one which concentrates carrier storage near its barrier layer. As a result, the first diode initially conducts when back-biased, but it later becomes abruptly nonconducting. This gives rise to an output that is equally abruptly terminated by the second diode after a duration determined by the extent of the pre-biasing.

It is an attribute of the invention that degradation in performance at high frequencies is curtailed by disposing the storage diodes in the center conductor of a coaxial line. This has the effect of mitigating electric field discontinuities.

Other attributes of the invention will become apparent after considering several illustrative embodiments taken in conjunction with the drawings in which.

Figure 1:
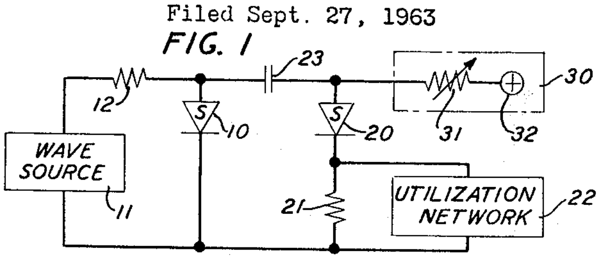
FIG. 1 is a schematic diagram of a storage diode pulse signal generator.

With reference to FIG. 1, a representative pulse generator in accordance with the invention is constituted of two storage diodes 10 and 20 connected in shunt. The first storage diode is energized from a wave source through a limiting resistor 12; the second is pre-biased from a current source 30 and connected to a load resistor 21 for a utilization network 22. Isolating the current source from the first storage diode is a coupling capacitor 23. Included in the current source is a variable control resistor 31 of appreciable resistive magnitude and a voltage source 32.

The storage diodes 10 and 20 have the characteristic that their charge carriers, i.e., holes, become concentrated near their barrier layers. An appropriate diode displaying this characteristic is designated 1N 914, manufactured by the Texas Instrument Company.

When a storage diode is forward-biased, it behaves like an ordinary asymmetrically conducting device and exhibits a negligible impedance across its terminals. Upon being back-biased, such a diode continues to conduct because of the carrier storage in the vicinity of its barrier layer. However, unlike an ordinary diode, when the back-biasing has endured for a sufficient duration at an appropriate signal level, the charge carriers are rapidly swept from the vicinity of the barrier layer and the impedance at the terminals of the diode becomes appreciable.

Figure 2A:
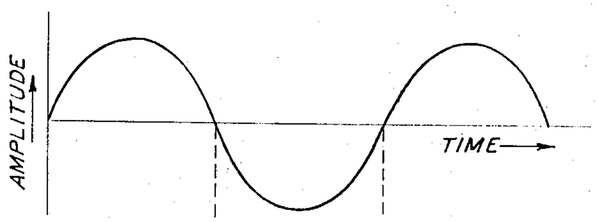
FIGS. 2A through 2C are wave form diagrams applicable to the pulse generator of FIG. 1.
Figure 2B:
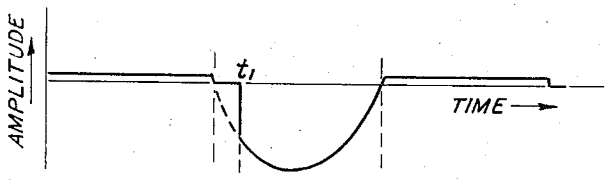
Figure 2C:
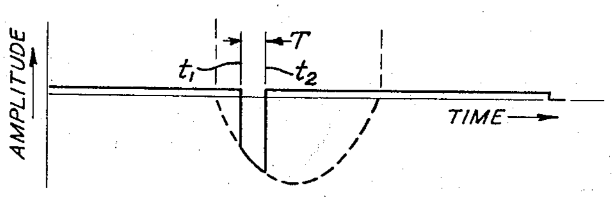

This phenomenon as employed by the invention is illustrated by the wave form diagrams of FIGS. 2A through 2C. In FIG 2A, the wave form is that of an ordinary sinusoid produced by the signal source of FIG. 1. FIG. 2B shows the voltage developed across the terminals of the first storage diode 10. As long as the diode 10 is forward-biased, its impedance is negligible and the voltage developed across its terminals is at a low level. When the sinusoidal signal of FIG. 2A becomes negative, the voltage does not significantly change initially because of carrier storage. Subsequently at a time $t_1$ the diode 10 becomes nonconducting the voltage developed at its terminals becomes substantially that of the source 11. Simultaneously the source voltage appears at the load resistor 21 because of the negligible impedance afforded to the abrupt transistion by the coupling capacitor and because the constant current source 30 maintains the second storage diode 20 in its conducting, and hence low impedance, condition. Nevertheless after duration T, as shown in FIG. 2C, the charge carriers initially stored from the constant current biasing source are themselves swept from the barrier layer of the diode 20 and the output suddenly terminates. As a consequence, a low frequency source 11 has been used to generate a pulse signal whose rise and fall times lie well within half a nanosecond or $5(10)^{-10}$ seconds.

To control the duration T of the pulse signal shown in FIG. 2C, the control resistor 31 of the constant current source 30 is adjusted to regulate the magnitude of the pre-biasing current. Adjustments of pulse duration to within a half nanosecond are possible and the duration may be extended well beyond three nanoseconds where desired.

Figure 3:
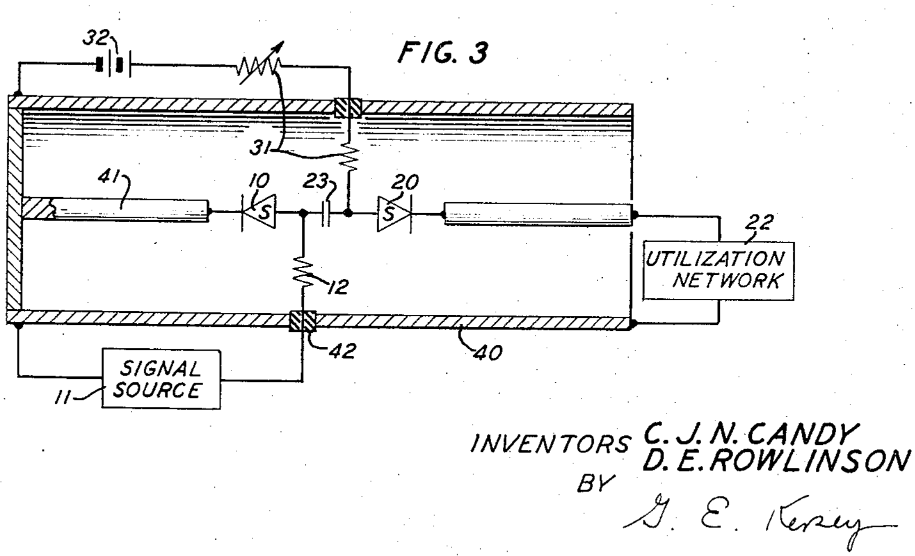
FIG. 3 is a microwave embodiment of the pulse generator in FIG. 1.

Since the invention provides for the generation of high-speed pulse signals, it is advantageously employed in a microwave embodiment such as that shown in FIG. 3 for which electric field discontinuities are curtailed and degradation of theoretical performance prevented.

As shown in FIG. 3 the components 10, 20 and 23 of FIG. 1 which are subject to the abrupt transitions that occur during pulse generation are included in the center conductor 41 of a coaxial line 40. The first diode 10 is energized from a low frequency signal source 11 through a dielectric bushing 42. The limiting resistor 12 is connected between the bushing and the capacitor-diode junction to prevent a high frequency short. A similar arrangement applies for the current source constituent 31.

In addition the resulting structure is symmetrical with respect to the various transitions that take place as the storage diodes 10 and 20 change from one operating condition to another.

Other adaptations and modifications of the invention will occur to those skilled in the art.

What is claimed is:

1. Apparatus for generating high-speed pulse signals which comprises a first storage diode, means for energizing said first diode, a second storage diode connected in shunt with the first and commonly poled with respect thereto, means for pre-biasing said second diode, and means for capacitively isolating the pre-biasing means from said first diode.

2. Apparatus comprising a first storage diode, a second storage diode in shunt with and responsive to the first, means for pre-biasing said second diode, and means for capacitively isolating the pre-biasing means from said first diode.

3. Apparatus as defined in claim 2, further including means for controlling the extent of the prebiasing.

4. A pulse signal generator comprising a first diode exhibiting carrier storage and having a barrier layer near which said carrier storage becomes concentrated, said diode having first and second terminals, a second diode, like the first, means exhibiting an appreciable impedance to steady energy and negligible impedance to fluctuating energy, said means interconnecting like terminals of the diodes with each other, load means interconnecting the remaining like terminals of said diodes with each other, and a source of steady energy interconnecting said second diode with said load means.

5. A microwave pulse signal generator comprising a coaxial transmission line, a short-circuit termination at one end of said line, a load termination at the other end of said line, oppositely poled storage diodes connected to form portion of the center conductor of said line, capacitive means included in said center conductor between said diodes and connected in series therewith, a low frequency wave source interconnecting said short-circuit termination with the junction of one diode and said capacitive means, and a current source interconnecting said short-circuit termination with the junction of the other diode and said capacitive means.

References Cited by the Examiner

UNITED STATES PATENTS

| | | | |
|---|---|---|---|
| 3,106,644 | 10/1963 | Retzinger | 307—88.5 |
| 3,192,410 | 6/1965 | Chow | 307—88.5 |
| 3,205,375 | 9/1965 | Berry et al. | 307—88.5 |
| 3,205,376 | 9/1965 | Berry et al. | 307—88.5 |

ARTHUR GAUSS, *Primary Examiner.*

R. H. EPSTEIN, *Assistant Examiner.*